(12) United States Patent
Kim et al.

(10) Patent No.: US 12,519,051 B2
(45) Date of Patent: Jan. 6, 2026

(54) SEMICONDUCTOR PACKAGE DEVICE (71) Applicant: Samsung Electronics Co., Ltd., Suwon-si (KR)

(72) Inventors: Jeongseok Kim, Cheonan-si (KR); Myungsam Kang, Hwaseong-si (KR); Youngchan Ko, Seoul (KR); Bongju Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 491 days.

(21) Appl. No.: 17/938,891

(22) Filed: Oct. 7, 2022

(65) Prior Publication Data

US 2023/0197596 A1 Jun. 22, 2023

(30) Foreign Application Priority Data

Nov. 17, 2021 (KR) .................. 10-2021-0158914

(51) Int. Cl.
  *H01L 23/498* (2006.01)
  *H01L 21/48* (2006.01)
  *H01L 23/00* (2006.01)
  *H01L 25/10* (2006.01)

(52) U.S. Cl.
  CPC .. *H01L 23/49838* (2013.01); *H01L 23/49827* (2013.01); *H01L 25/105* (2013.01); *H01L 21/486* (2013.01); *H01L 24/08* (2013.01); *H01L 24/48* (2013.01); *H01L 2224/08235* (2013.01); *H01L 2224/48228* (2013.01); *H01L 2225/1041* (2013.01); *H01L 2225/1058* (2013.01); *H01L 2924/1431* (2013.01); *H01L 2924/1436* (2013.01); *H01L 2924/14511* (2013.01)

(58) Field of Classification Search
  CPC ......... H01L 23/49838; H01L 23/49827; H01L 24/08; H01L 25/105; H01L 2225/041; H01L 2225/1058
  USPC ....................................................... 257/734
  See application file for complete search history.

(56) References Cited

U.S. PATENT DOCUMENTS

| 9,449,953 | B1 | 9/2016 | Shih et al. |
| 9,768,105 | B2 | 9/2017 | Lii et al. |
| 10,163,862 | B2 | 12/2018 | Chen et al. |
| 10,256,114 | B2 | 4/2019 | Huemoeller et al. |
| 10,325,891 | B1 | 6/2019 | Lim et al. |

(Continued)

FOREIGN PATENT DOCUMENTS

| JP | 5294611 B2 | 6/2013 |
| KR | 10-2014-0078198 A | 6/2014 |
| KR | 10-2019-0025097 A | 3/2019 |

*Primary Examiner* — Jasmine J Clark
(74) *Attorney, Agent, or Firm* — Wolf, Greenfield & Sacks, P.C.

(57) ABSTRACT

Disclosed is a semiconductor package device comprising a lower redistribution substrate, a first semiconductor chip on the lower redistribution substrate, vertical structures on the lower redistribution substrate, and a first molding member on the lower redistribution substrate and on the first semiconductor chip and the vertical structures. The vertical structure includes a first post having a first diameter, a second post on the first post and having a second diameter, and a bonding pad on the second post opposite the first post and having a third diameter. The first, second, and third diameters are different from each other. The third diameter is greater than the second diameter.

20 Claims, 11 Drawing Sheets (56) References Cited

U.S. PATENT DOCUMENTS

| | | |
|---|---|---|
| 10,354,982 B2 | 7/2019 | Tsai et al. |
| 10,388,598 B2 | 8/2019 | Lu et al. |
| 12,021,020 B2 * | 6/2024 | Kang ................. H01L 24/14 |
| 2007/0241463 A1 | 10/2007 | Yamaguchi et al. |
| 2018/0277394 A1 * | 9/2018 | Huemoeller .......... H01L 21/565 |
| 2021/0134728 A1 | 5/2021 | Rubin et al. |

* cited by examiner

SEMICONDUCTOR PACKAGE DEVICE

CROSS-REFERENCE TO RELATED APPLICATION

This U.S. nonprovisional application claims priority under 35 U.S.C § 119 to Korean Patent Application No. 10-2021-0158914 filed on Nov. 17, 2021 in the Korean Intellectual Property Office, the disclosure of which is hereby incorporated by reference in its entirety.

BACKGROUND

The present inventive concepts relate to a semiconductor package device.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of electronics industry, various studies have been conducted to improve reliability and durability of semiconductor packages.

SUMMARY

Some embodiments of the present inventive concepts provide a semiconductor package device having the degree of freedom of wiring design and fine pitches.

According to some embodiments of the present inventive concepts, a semiconductor package device may comprise: a lower redistribution substrate; a first semiconductor chip on the lower redistribution substrate; a plurality of vertical structures on the lower redistribution substrate; and a first molding member on the lower redistribution substrate, the first molding member on the first semiconductor chip and the vertical structures. The vertical structure may include: a first post having a first diameter; a second post on the first post and having a second diameter; and a bonding pad on the second post opposite the first post and having a third diameter. The first, second, and third diameters may be different from each other. The third diameter may be greater than the second diameter.

According to some embodiments of the present inventive concepts, a semiconductor package device may comprise: a redistribution substrate; a semiconductor chip on the redistribution substrate; a plurality of vertical structures on the redistribution substrate; and a molding member on the redistribution substrate, the semiconductor chip, and the vertical structures. The vertical structure may include: a first post having a first diameter; a second post on the first post and having a second diameter; and a bonding pad on the second post opposite the first post and having a third diameter. The first, second, and third diameters may be different from each other. The molding member may be in contact with an edge portion of a bottom surface of the bonding pad.

According to some embodiments of the present inventive concepts, a semiconductor package device may comprise: a first semiconductor package; and a second semiconductor package on the first semiconductor package. The first semiconductor package may include: a redistribution substrate; a first semiconductor chip on the redistribution substrate, the first semiconductor chip including a chip pad on a surface of the first semiconductor chip, the surface facing the redistribution substrate; a plurality of vertical structures on the redistribution substrate and spaced apart from a lateral surface of the first semiconductor chip; a first molding member on a top surface of the first semiconductor chip, the lateral surface of the first semiconductor chip, and a top surface of each of the vertical structures; and a plurality of first connection terminals below the redistribution substrate. Each of the vertical structures may include a first post, a second post on the first post, and a bonding pad on the second post. Each of the first post, the second post, and the bonding pad may have a cylindrical shape. The second semiconductor package may include: a package substrate; a second semiconductor chip on the package substrate; a second molding member on the package substrate and the second semiconductor chip; a metal pad in a lower portion of the package substrate; and a second connection terminal between the bonding pad and the metal pad. A diameter of the second post may be about 5 μm to about 10 μm less than a diameter of the bonding pad. The vertical structures may be spaced apart from each other along a first direction parallel to a top surface of the redistribution substrate. The second posts may be spaced apart a first distance from each other along the first direction. The bonding pads may be spaced apart a second distance from each other along the first direction. The first distance may be less than the second distance.

DETAILED DESCRIPTION OF EMBODIMENTS

The following will now describe a semiconductor package device according to the present inventive concepts with reference to accompanying drawings.

Figure 1:
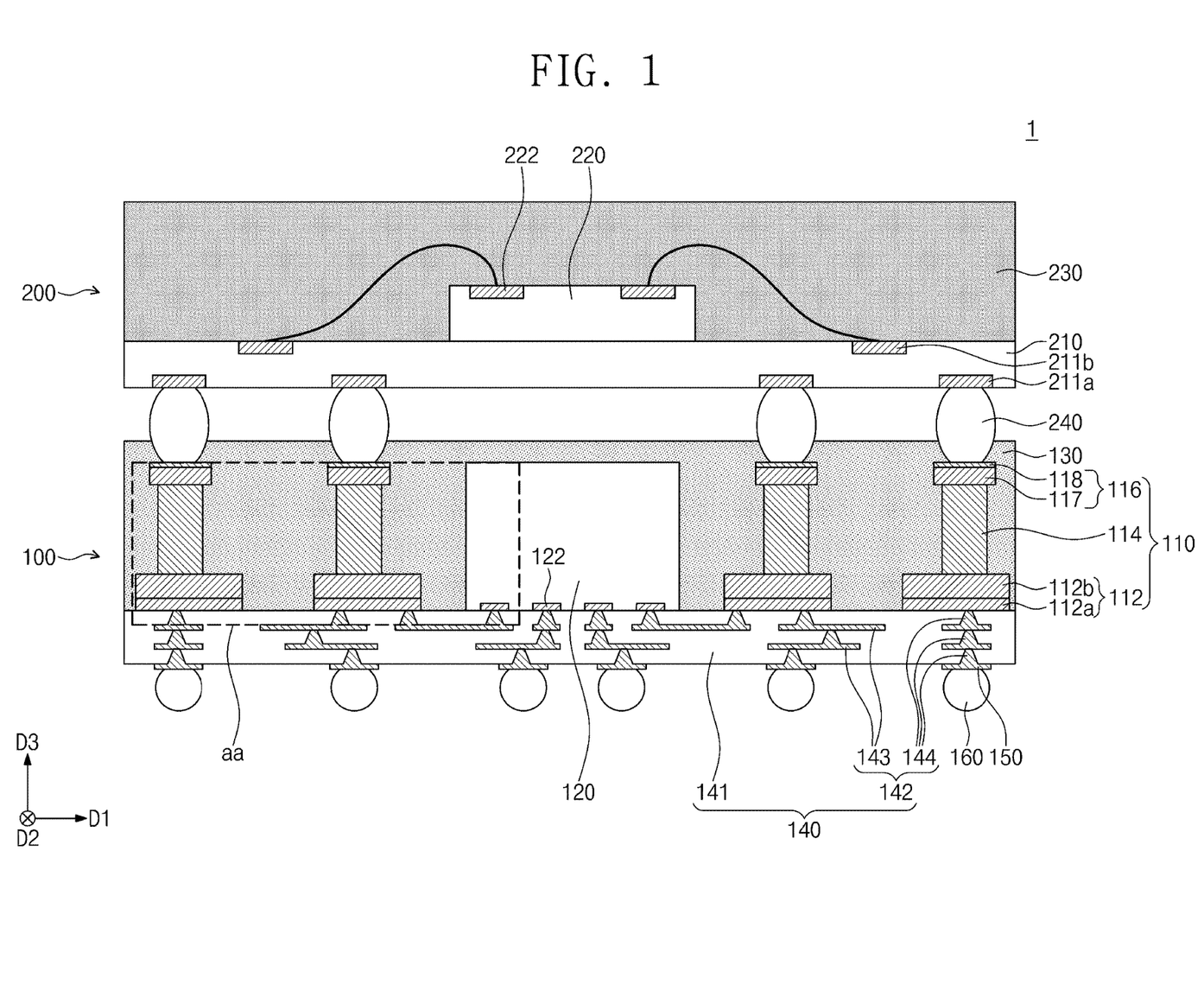
FIG. 1 illustrates a cross-sectional view showing a semiconductor package device according to some embodiments of the present inventive concepts.
Figure 2:
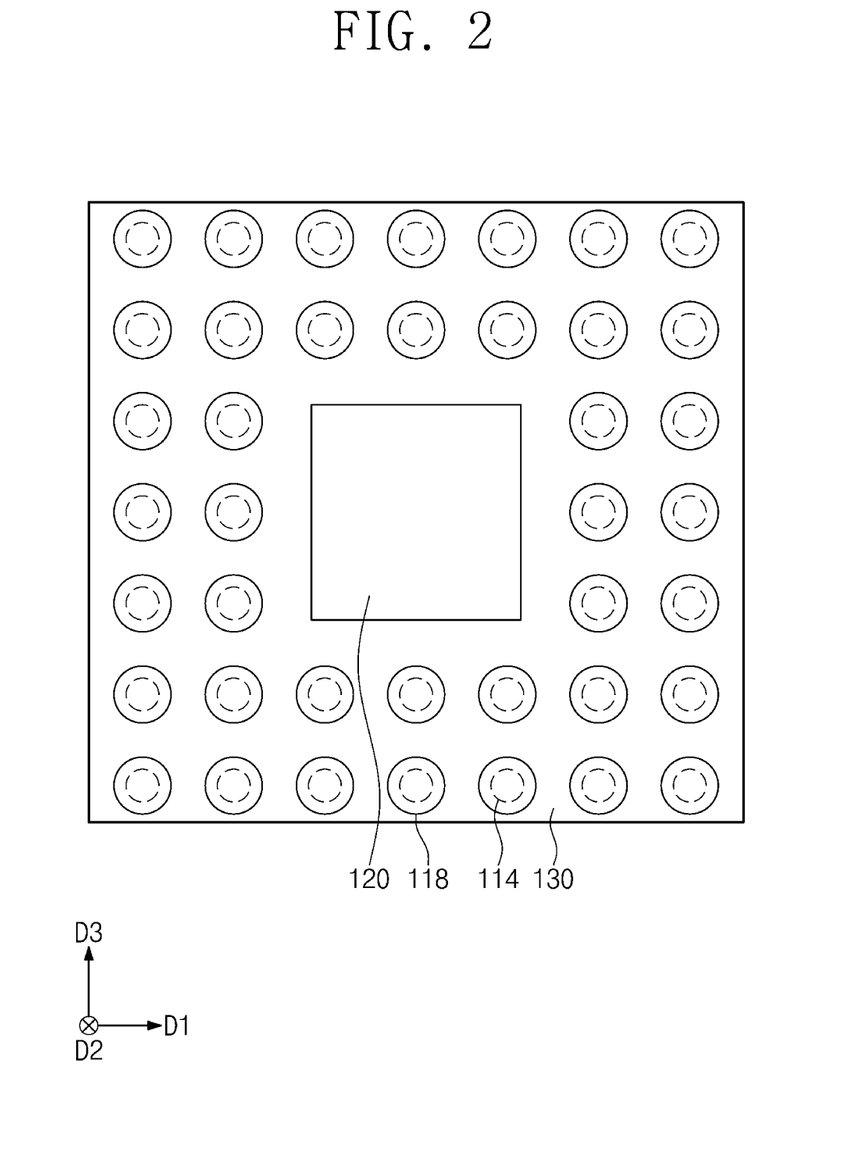
FIG. 2 illustrates a plan view showing a first semiconductor package of FIG. 1.
Figure 3:
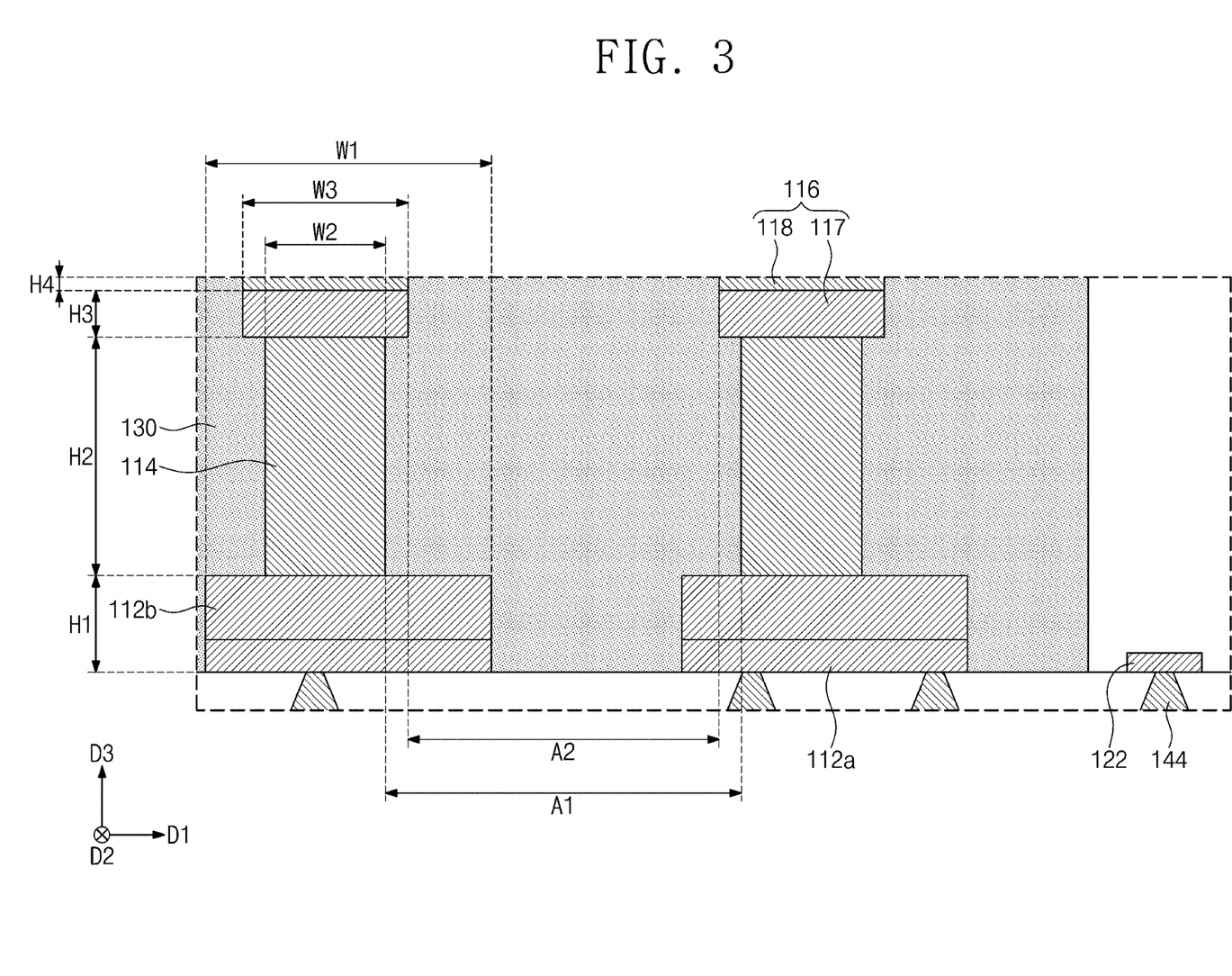
FIG. 3 illustrates an enlarged view showing section aa of FIG. 1.

FIG. 1 illustrates a cross-sectional view showing a semiconductor package device according to some embodiments of the present inventive concepts. FIG. 2 illustrates a plan view showing a first semiconductor package of FIG. 1. FIG. 3 illustrates an enlarged view showing section aa of FIG. 1.

Referring to FIG. 1, a semiconductor package device 1 according to the present inventive concepts may include a first semiconductor package 100 and a second semiconductor package 200 on the first semiconductor package 100. The semiconductor package device 1 may have a package-on-package structure.

The first semiconductor package 100 may include a lower redistribution substrate 140, a first semiconductor chip 120, a plurality of vertical structures 110, a first molding member 130, under-bump patterns 150, and first connection terminals 160.

The lower redistribution substrate 140 may include a first dielectric layer 141 and first redistribution patterns 142 in the first dielectric layer 141. Although the first dielectric layer 141 is illustrated as a single layer, the first dielectric layer 141 may be formed of a plurality of dielectric layers. The first dielectric layer 141 may be formed of photo-imageable dielectric (PID). The first dielectric layer 141 may include, for example, a photosensitive polymer. The photosensitive polymer may include one or more of polyimide, polybenzoxazole, benzocyclobutene, and epoxy. The first redistribution patterns 142 may each include a first wire portion 143 and a first via portion 144. The first wire portion 143 and the first via portion 144 may be integrally formed into a single unitary piece.

The first semiconductor chip 120 may be on the lower redistribution substrate 140. The first semiconductor chip 120 may be, for example, a logic chip. The first semiconductor chip 120 may include first chip pads 122 electrically connected to the first redistribution patterns 142. The first chip pad 122 may be in contact with the first via portion 144. The first semiconductor chip 120 may be connected to the first redistribution patterns 142 without separate connection terminals (e.g., bumps or solder balls). While the first connection terminals 160 may be on a region that vertically overlap the first semiconductor chip 120, the first connection terminals 160 may be on a region that does not vertically overlap the first semiconductor chip 120. In this case, the first semiconductor package 100 of FIG. 1 may be a fan-out semiconductor package formed in a chip-first process.

The vertical structures 110 may be on the lower redistribution substrate 140 while surrounding the first semiconductor chip 120. Each of the vertical structures 110 may include a first post 112, a second post 114, and a bonding pad 116.

Referring to FIGS. 1 and 2, the first post 112, the second post 114, and the bonding pad 116 may each have a cylindrical shape. When viewed in plan, each of the first post 112, the second post 114, and the bonding pad 116 may have a circular shape or an almost circular shape. However, it should be understood that different shapes may be used; for example, each of the first post 112, the second post 114, and the bonding pad 116 may have a tetragonal pillar shape or any other polygonal pillar shape.

The first post 112 may include a seed pattern 112a and a metal pattern 112b. The seed pattern 112a may be in contact with the first via portion 144 of an uppermost one of the first redistribution patterns 142. The metal pattern 112b may be on the seed pattern 112a. The seed pattern 112a and the metal pattern 112b may include the same metallic material. For example, the seed pattern 112a and the metal pattern 112b may include copper.

The second post 114 may be on the first post 112. The second post 114 may extend in a vertical direction. The second post 114 may be in contact with a top surface of the first post 112. The second post 114 may include the same metallic material as that of the first post 112. For example, the second post 114 may include copper.

The bonding pad 116 may be on on the second post 114. The bonding pad 116 may extend in a vertical direction. That is, the bonding pad 116 may be on a top surface or side of the second post 114 that is opposite the first post 112. The bonding pad 116 may include a first metal layer 117 in contact with a top surface of the second post 114 and a second metal layer 118 in contact with a top surface of the first metal layer 117. The first and second metal layers 117 and 118 may include different metallic materials from each other. For example, the first metal layer 117 may include nickel (Ni), and the second metal layer 118 may include gold (Au).

Referring to FIGS. 1 and 3, the first post 112, the second post 114, and the bonding pad 116 may respectively have a first diameter W1, a second diameter W2, and a third diameter W3. The first, second, and third diameters W1, W2, and W3 may be different from one another.

The first diameter W1 may be greater than the second diameter W2 and the third diameter W3. The second diameter W2 may be less than the third diameter W3.

For example, the third diameter W3 may range from about 50 μm to about 60 μm, and the second diameter W2 may range from about 40 μm to about 55 μm. A difference between the third diameter W3 and the second diameter W2 may be substantially the same as a thickness of the seed pattern 112a. For example, when the thickness of the seed pattern 112a is in a range of about 5 μm to about 10 μm, the difference between the third diameter W3 and the second diameter W2 may be in a range of about 5 μm to about 10 μm.

The vertical structures 110 may be spaced apart from each other. The second posts 114 may be spaced apart at a first distance A1 from each other along a first direction D1 parallel to a top surface of the lower redistribution substrate 140 and along a second direction D2 that intersects the first direction D1 and is parallel to the top surface of the lower redistribution substrate 140. The bonding pads 116 may be spaced apart at a second distance A2 from each other along the first direction D1 and the second direction D2.

The first distance A1 may be greater the second distance A2. For example, the first distance A1 may range from about 65 μm to about 90 μm, and the second distance A2 may range from about 60 μm to about 80 μm.

The first post 112, the second post 114, the first metal layer 117, and the second metal layer 118 may respectively have vertical thicknesses of heights, including a first height H1, a second height H2, a third height H3, and a fourth height H4 that are measured in a third direction D3 perpendicular to the top surface of the lower redistribution substrate 140.

The first height H1 may be less than the second height H2. The first height H1 may range from about 30 μm to about 40 μm, and the second height H2 may range from about 70 μm to about 80 μm. The third height H3 may range from about 5 μm to about 8 μm. The fourth height H4 may range from about 0.1 μm to about 0.7 μm.

According to the present inventive concepts, as the first post 112 has a diameter greater than that of the second post 114, there may be an increase in the degree of freedom in designing the second post 114 and the first redistribution pattern 142. For example, the second post 114 may not vertically overlap the first redistribution patterns 142 in contact with the first post 112, and may be at any location on the first post 112. In particular, the second post 114 may be on an arbitrary position on the top surface of the first post 112, and thus there may be an increase in the degree of freedom of wiring. For example, the second post 114 may be offset from a center of the top surface of the first post 112. In some embodiments, the second post 114 is offset from the center of the top surface of the first post 112 in a direction away from the semiconductor chip 120.

Referring back to FIG. 1, the first molding member 130 may be on the lower redistribution substrate 140. The first molding member 130 may be on top and lateral surfaces of the first semiconductor chip 120, lateral surfaces of the vertical structures 110, and the top surface of the lower redistribution substrate 140. The first molding member 130 may include a dielectric material. The first molding member 130 may include a thermosetting resin such as epoxy resins, a thermoplastic resin such as polyimide, or a resin (e.g., Ajinomoto build-up film (ABF), a flame retardant 4 (FR-4), bismaleimide triazine (BT), epoxy molding compound (EMC)) including a reinforcement member such as inorganic fillers. The first molding member 130 may include, for example, an Ajinomoto build-up film (ABF).

The first molding member 130 may have a pad opening, and the pad opening may expose a top surface of the second metal layer 118.

The first molding member 130 may be on a lateral surface of the first post 112, a portion of the top surface of the first post 112, a lateral surface of the second post 114, top and lateral surfaces of the bonding pad 116, and an edge portion of a bottom surface of the bonding pad 116.

The under-bump patterns 150 may be on a bottom surface of the first dielectric layer 141 and may be connected to the first redistribution patterns 142. The under-bump patterns 150 may include, for example, copper.

The first connection terminals 160 may be below the under-bump patterns 150. The first connection terminals 160 may be solders or bumps. The first connection terminals 160 may be electrically connected through the under-bump patterns 150 to the first redistribution patterns 142.

The second semiconductor package 200 may be on the first molding member 130. The second semiconductor package 200 may include a package substrate 210, a second semiconductor chip 220, and a second molding member 230. The second molding member 230 may include, for example, an epoxy molding compound (EMC). The package substrate 210 may be a printed circuit board. The package substrate 210 may include metal pads 211a and 211b on opposite surfaces thereof.

The second semiconductor chip 220 may be a memory chip, such as DRAM or NAND Flash. The second semiconductor chip 220 may be of the same type as or different type from the first semiconductor chip 120. The second semiconductor chip 220 may include a second chip pad 222 on one surface that is wire-bonded to the metal pad 211b of the package substrate 210.

One or more second connection terminals 240 may be between the first semiconductor package 100 and the second semiconductor package 200. The second connection terminal 240 may be in contact with the metal pad 211a and the bonding pad 116. The first semiconductor package 100 and the second semiconductor package 200 may be electrically connected to each other through the second connection terminal 240.

FIGS. 4 to 13 illustrate cross-sectional views showing a method of fabricating a semiconductor package device according to some embodiments of the present inventive concepts.

Figure 4:
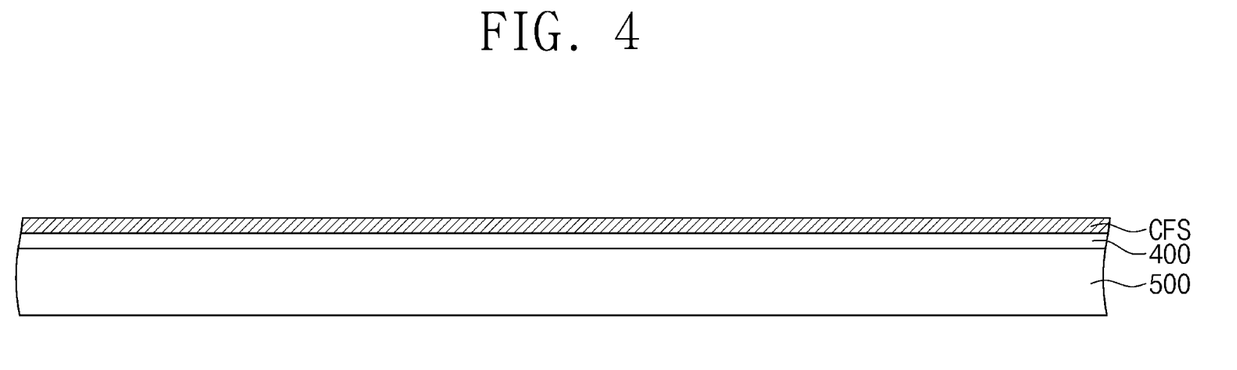
FIGS. 4 to 13 illustrate cross-sectional views showing a method of fabricating a semiconductor package device according to some embodiments of the present inventive concepts.

Referring to FIG. 4, a carrier 500 and an adhesion layer 400 may be provided. The adhesion layer 400 may include, for example, a polyimide tape.

A seed layer CFS may be attached to the adhesion layer 400. The seed layer CFS may be, for example, a copper foil. The seed layer CFS may have a thickness of about 5 µm to about 10 µm.

Figure 5:
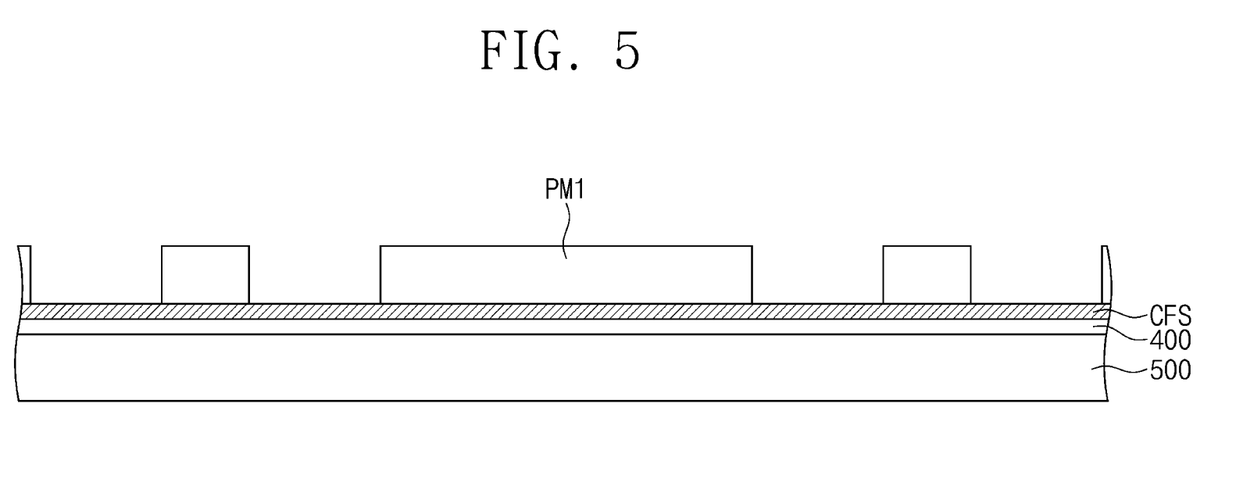

Referring to FIG. 5, a first photomask pattern PM1 may be formed on the seed layer CFS. The first photomask pattern PM1 may include a plurality of openings. The first photomask pattern PM1 may be formed by coating, exposing, and developing a photoresist layer.

Figure 6:
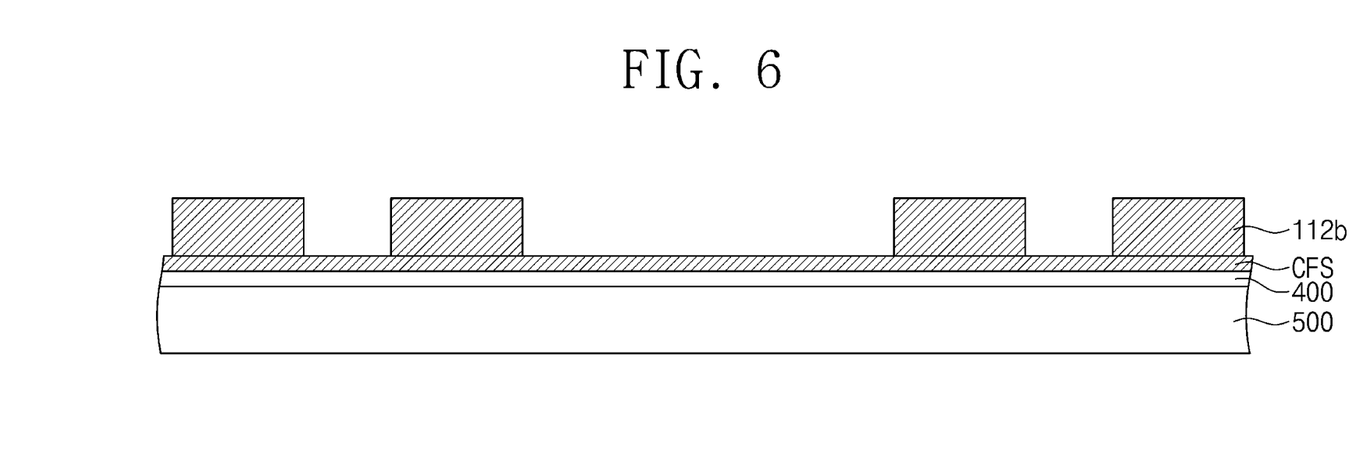

Referring to FIG. 6, an electroplating process may be performed in which the seed layer CFS is used as an electrode to from a metal pattern 112b in the opening of FIG. 5. After the metal pattern 112b is formed, the first photomask pattern PM1 may be removed.

Figure 7:
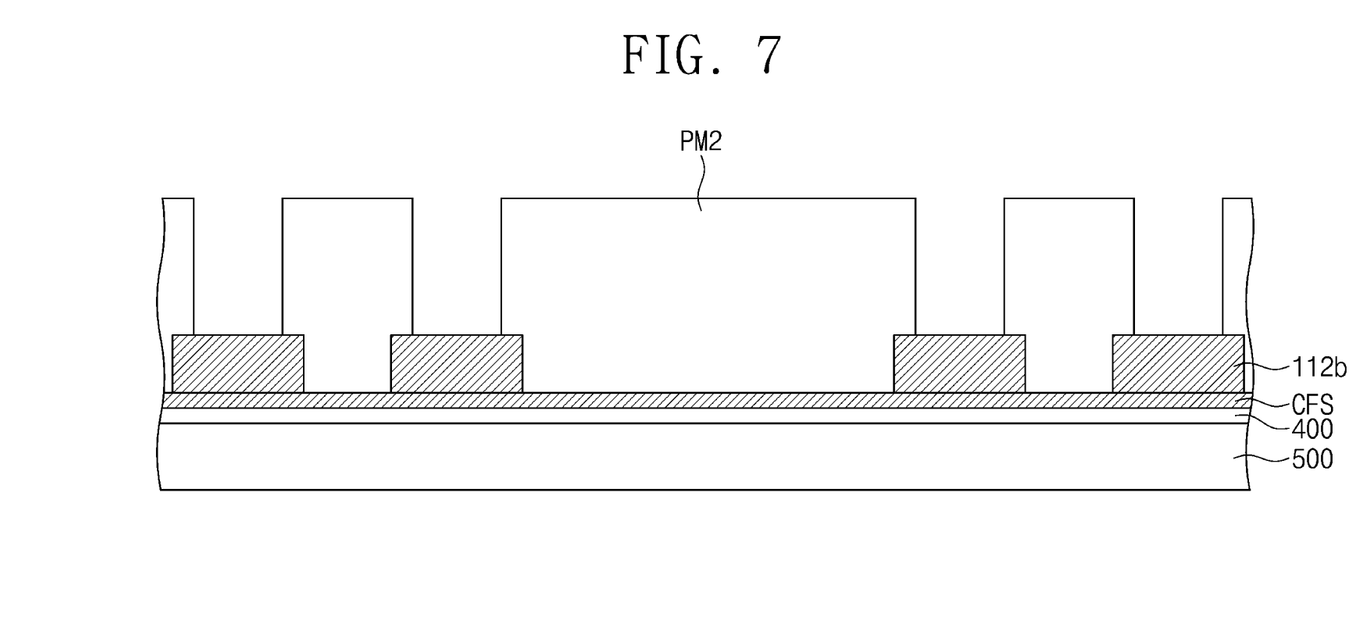

Referring to FIG. 7, a second photomask pattern PM2 may be formed to partially expose a top surface of the metal pattern 112b. The second photomask pattern PM2 may include an opening that defines a space in which are formed a second post 114 and a bonding pad 116 which will be discussed below. The second photomask pattern PM2 may be formed by a method substantially the same as that used for forming the first photomask pattern PM1.

Figure 8:
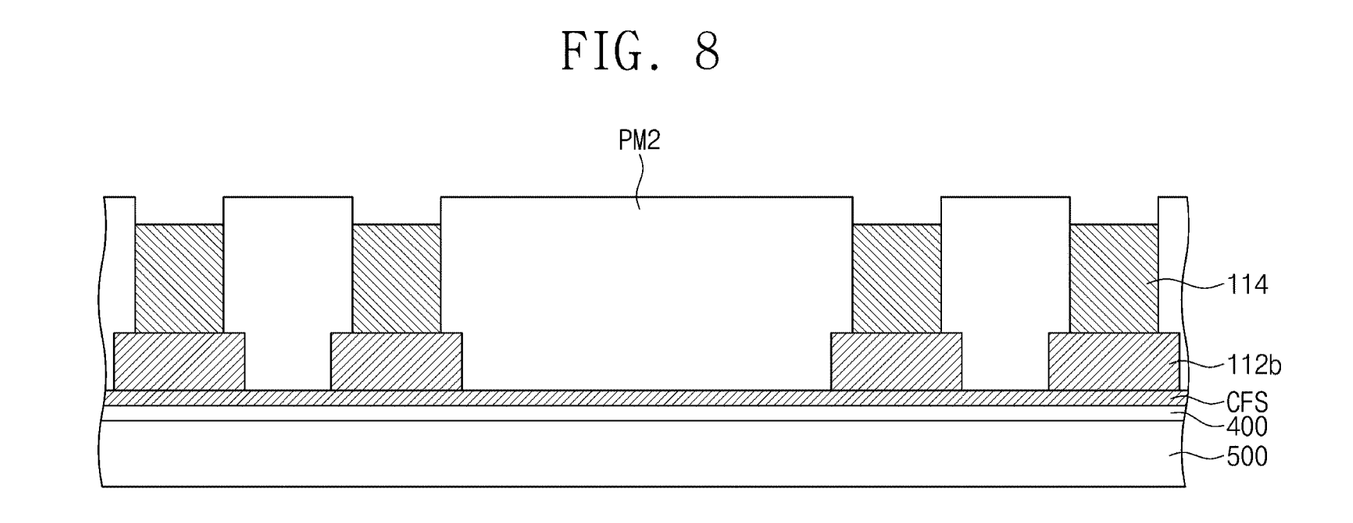

Referring to FIG. 8, an electroplating process may be performed in which the seed layer CFS is used as an electrode to form a second post 114 in the opening of FIG. 7. The second post 114 may be formed to have a top surface lower than that of the second photomask pattern PM2. The second post 114 may be formed by a method substantially the same as that used for forming the first post 112.

Figure 9:
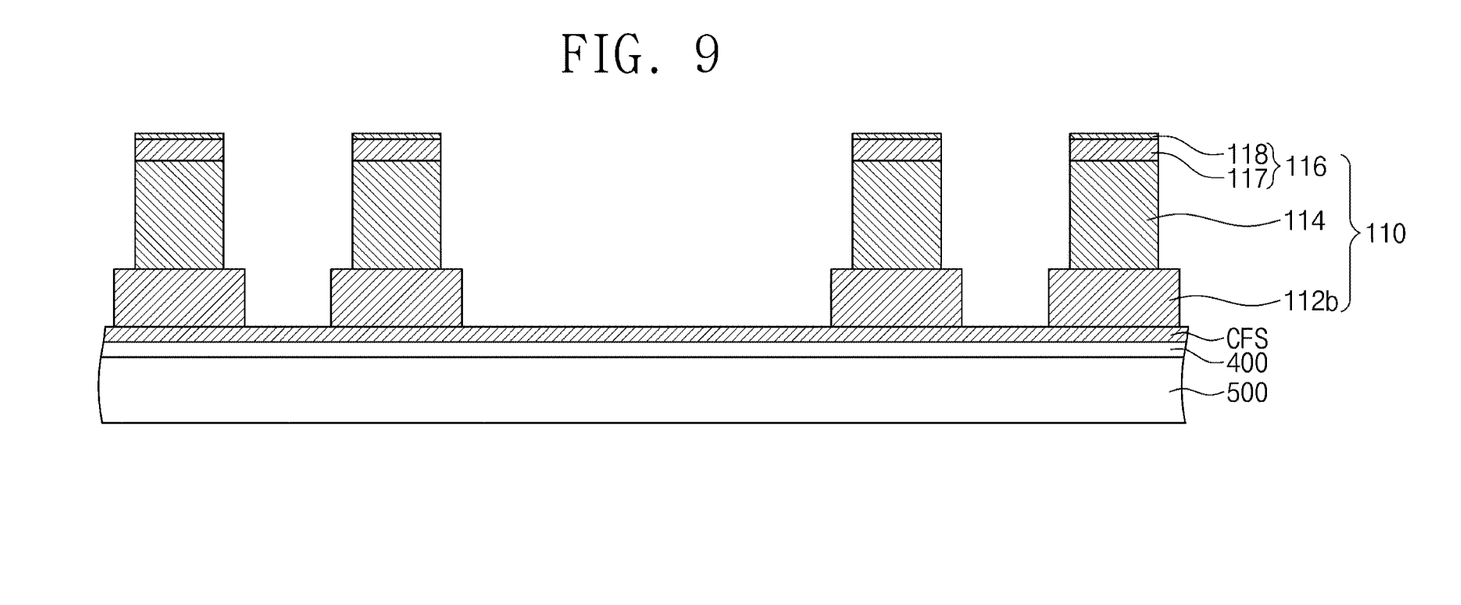

Referring to FIG. 9, an electroplating process may be performed in which the seed layer CFS is used as an electrode to form a bonding pad 116 on the second post 114.

A first metal layer 117 may be formed on the second post 114, and then a second metal layer 118 may be formed on the first metal layer 117.

The bonding pad 116 may be adjusted to have a top surface at a level substantially the same as that of the top surface of the second photomask pattern PM2. According to some embodiments, the top surface of the bonding pad 116 may be located at a level lower or higher than that of the top surface of the second photomask pattern PM2. After the bonding pad 116 is formed, the second photomask pattern PM2 may be removed.

Figure 10:
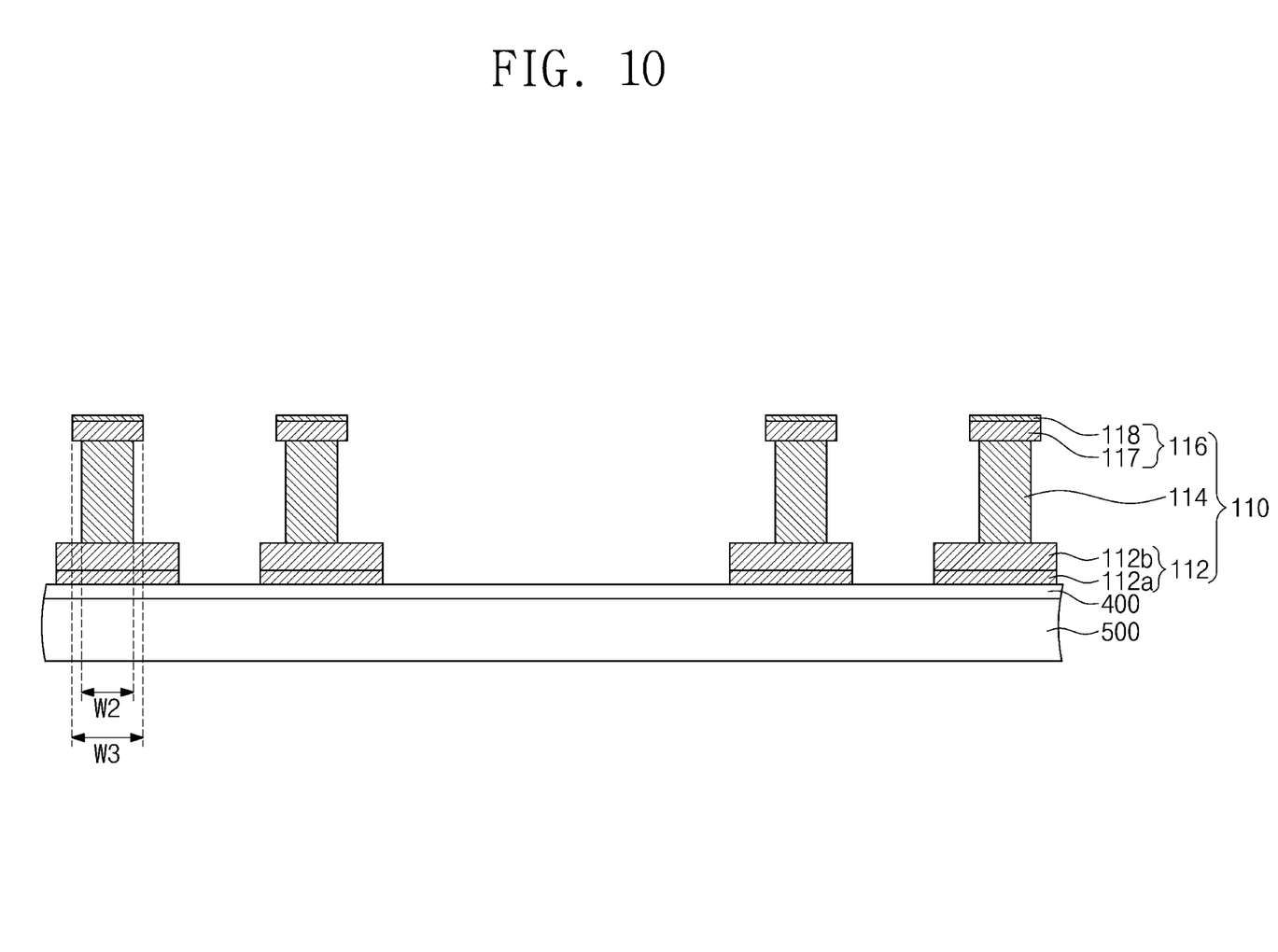

Referring to FIG. 10, the bonding pad 116 may be used as an etching mask to perform an etching process. The etching process may remove portions of the seed layer CFS (e.g., copper foil) that are not vertically overlapped the metal patterns 112b. The seed layer CFS may be partially etched to form a seed pattern 112a. The seed pattern 112a and the metal pattern 112b may constitute a first post 112.

The etching process may be, for example, selective wet etching. The etching process may be performed to etch a lateral surface of the second post 114. Therefore, a second diameter W2, or a diameter of the second post 114, may become less than a third diameter W3, or a diameter of the bonding pad 116.

According to the present inventive concepts, when the seed layer CFS, or copper foil, is partially removed, the bonding pad 116 may be used as an etching mask without additionally forming a separate photomask pattern as an etching mask, with the result that it may be possible to reduce processing steps. In addition, because the lateral surface of the second post 114 is etched during the etching process, it may be possible to form the second post 114 having a small diameter. As a result, a semiconductor package device may be achieved to include fine-pitched vertical structures.

Figure 11:
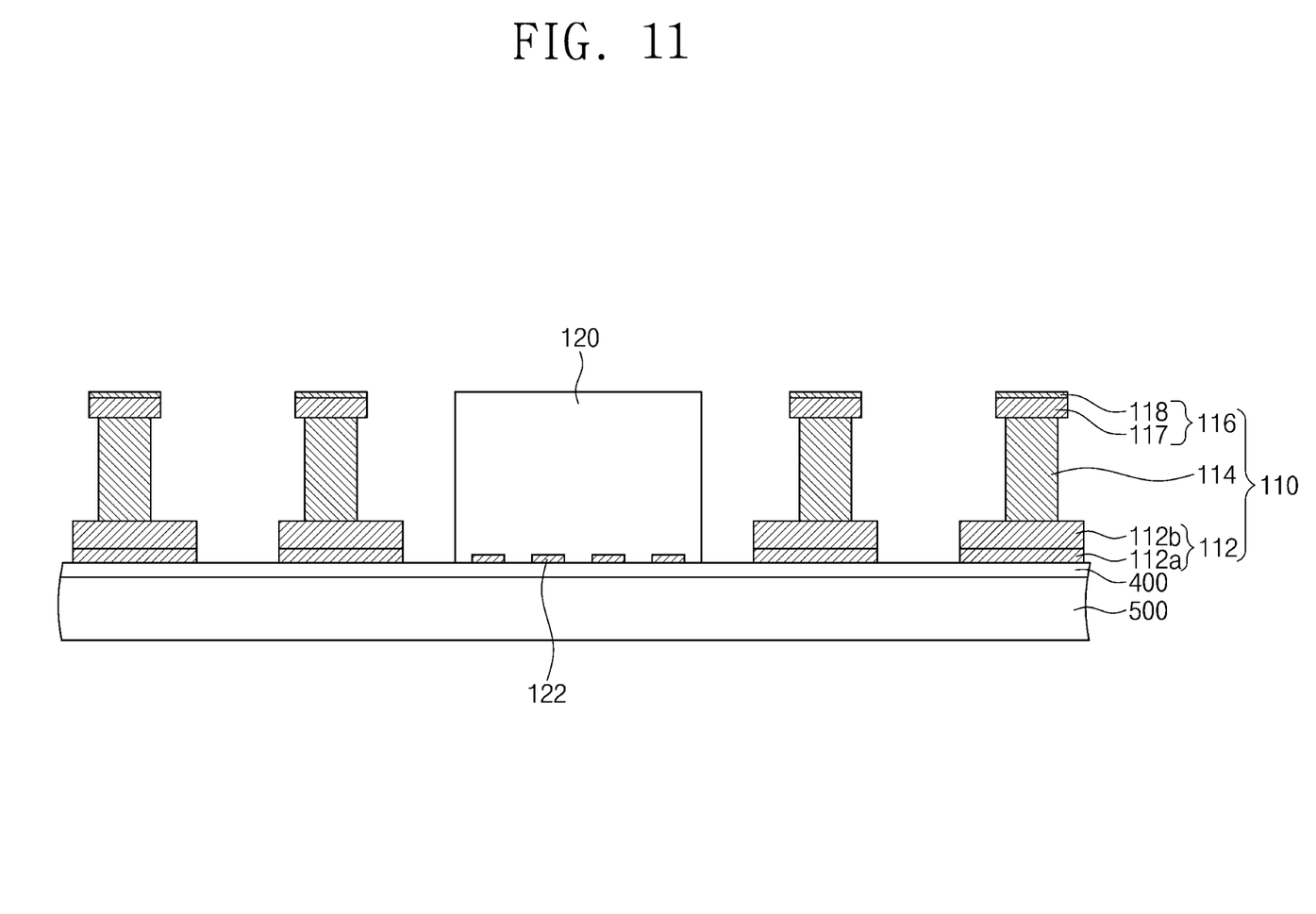

Referring to FIG. 11, a first semiconductor chip 120 may be attached to the adhesion layer 400. The first semiconductor chip 120 may be adhered to allow its first chip pad 122 to face the adhesion layer 400.

Figure 12:
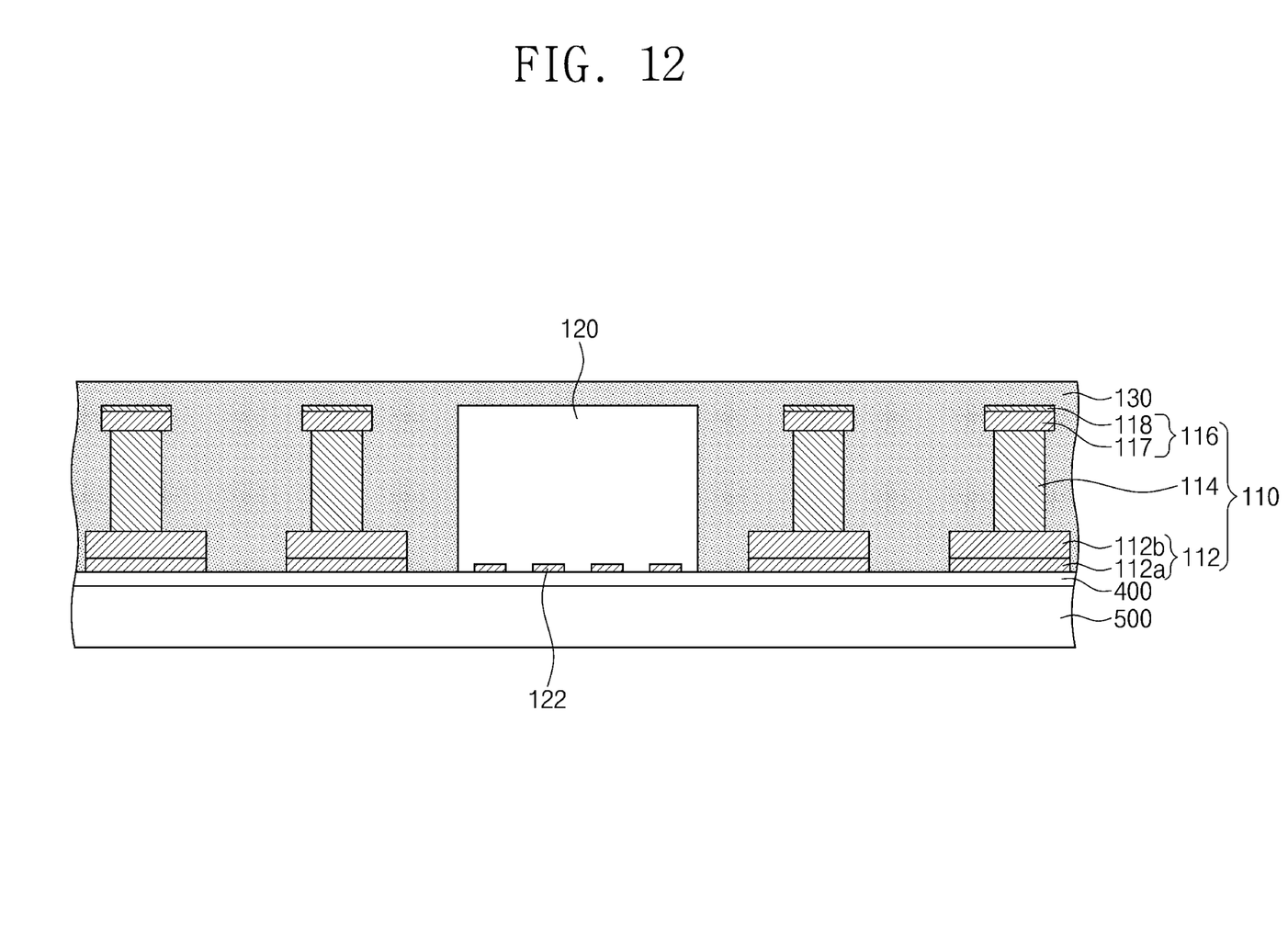

Referring to FIG. 12, a first molding member 130 may be formed on the adhesion layer 400. The first molding member 130 may be on (e.g., may cover) the first semiconductor chip 120 and the vertical structures 110. The first molding member 130 may be on (e.g., may cover) a lateral surface and a portion of a top surface of the first post 112, a lateral surface of the second post 114, and a top surface, a lateral surface, and a portion of a bottom surface of the bonding pad 116.

After the first molding member 130 is formed, the adhesion layer 400 and the carrier 500 may be removed.

Figure 13:
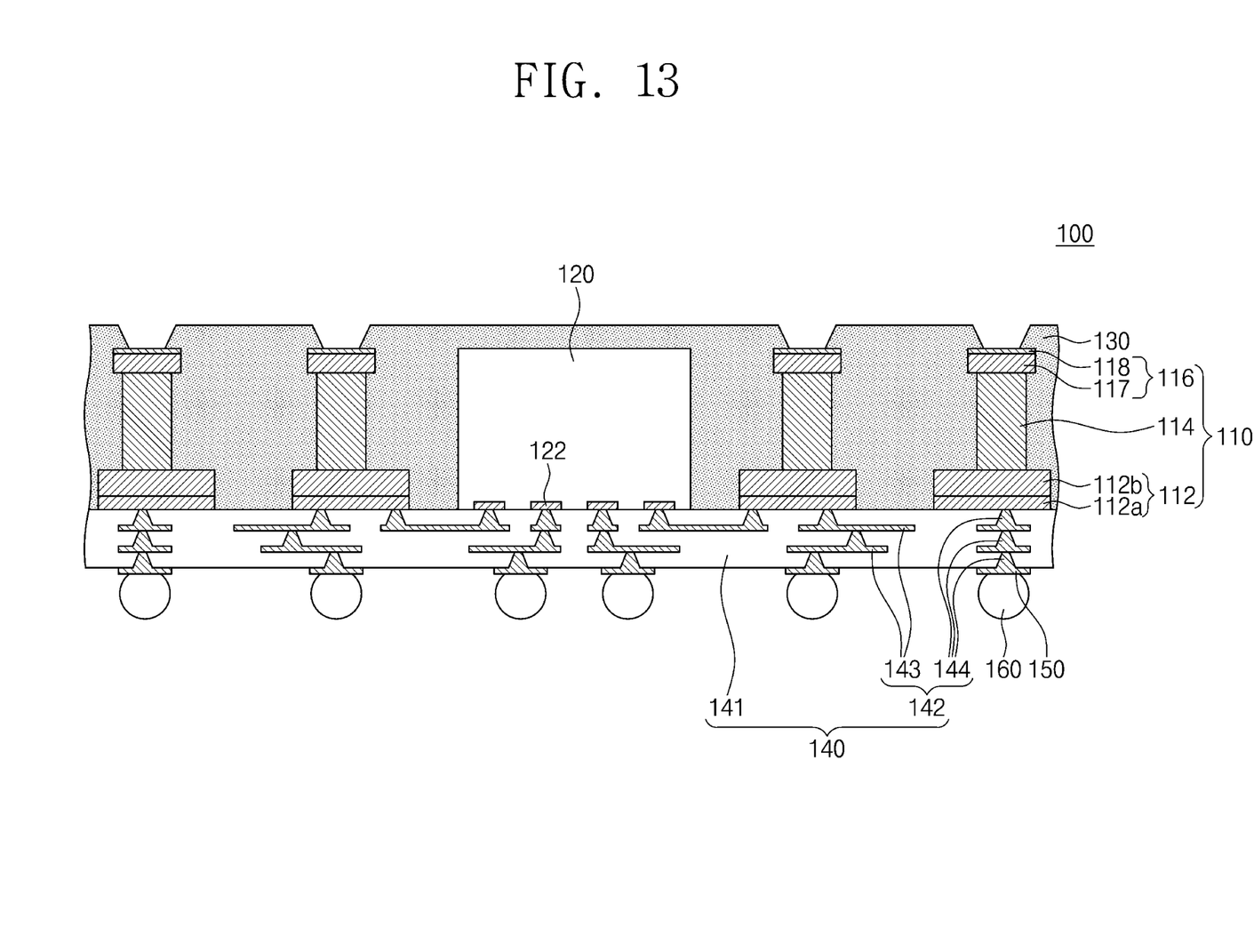

Referring to FIG. 13, a lower redistribution substrate 140 may be formed on an active surface of the first semiconductor chip 120. The lower redistribution substrate 140 may include a first dielectric layer 141 and first redistribution patterns 142 in the first dielectric layer 141. The first dielectric layer 141 may have a structure in which a plurality of photo-imageable dielectric layers are stacked. The photo-imageable dielectric layers may be formed by a coating process such as spin coating or slit coating, a photo-patterning process, and a curing process. The first redistribution patterns 142 may be formed by, for example, an electroplating process and a patterning process. A first wire portion 143 and a first via portion 144 may be integrally formed into a single unitary piece.

Under-bump patterns 150 may be formed below the first dielectric layer 141. The under-bump patterns 150 may be formed by, for example, an electroplating process and a patterning process. First connection terminals 160 may be formed below the under-bump patterns 150. A laser drilling process or other etching process may be performed to form a pad opening that exposes an uppermost surface of the bonding pad 116, or a top surface of the second metal layer 118. Through the processes discussed above, a first semiconductor package 100 may be formed.

Referring back to FIG. 1, a second semiconductor package 200 may be attached to the first semiconductor package 100. For example, a second connection terminal 240 may contact the top surface of the bonding pad 116, and an annealing process may be performed. As a result, a semiconductor package device 1 may be fabricated.

Figure 14:
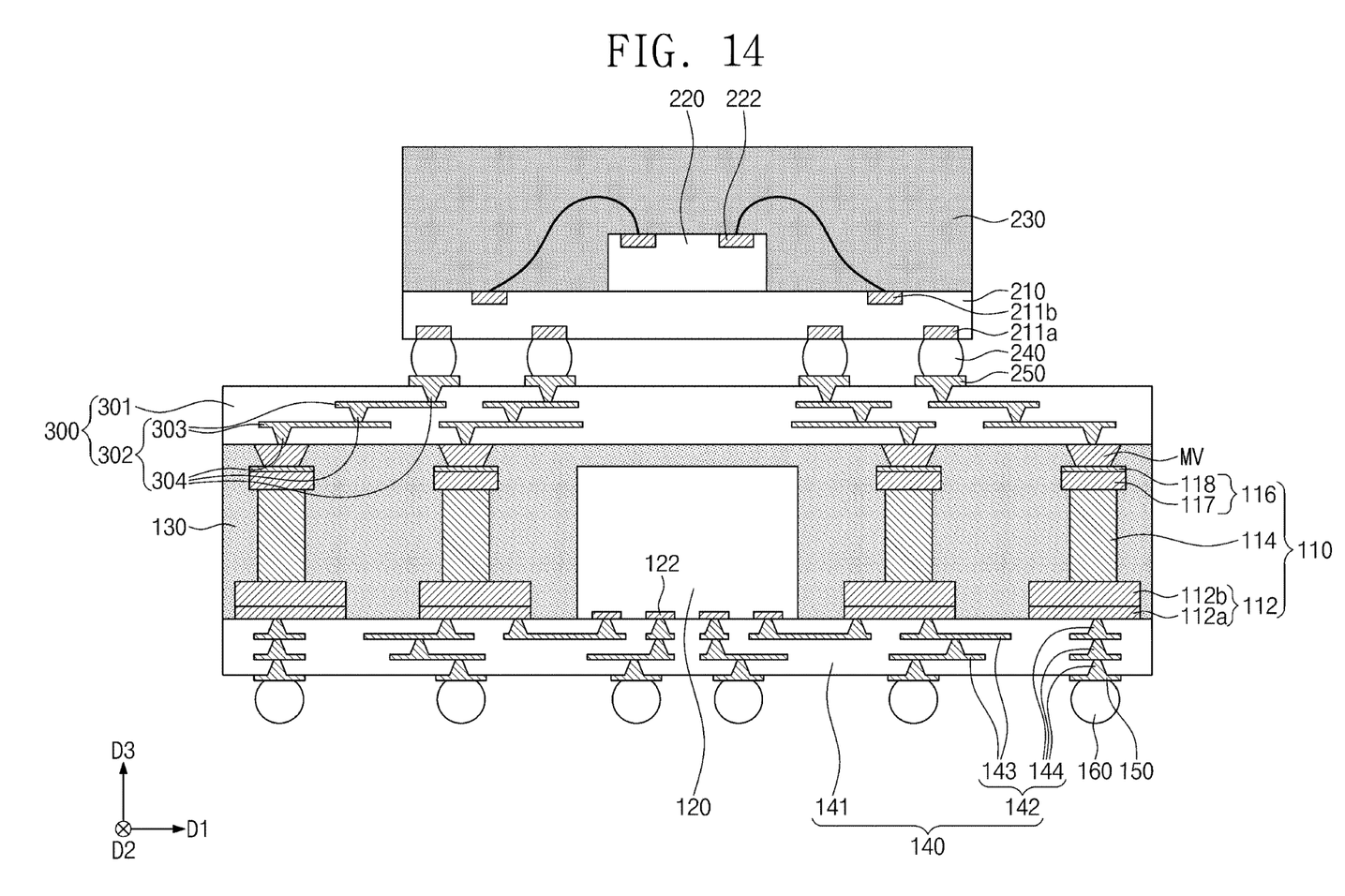
FIG. 14 illustrates a cross-sectional view showing a semiconductor package device according to some embodiments of the present inventive concepts.

FIG. 14 illustrates a cross-sectional view showing a semiconductor package device according to some embodiments of the present inventive concepts. There will be omission of explanation repetitive to that disclosed in FIGS. 1 to 3, except the following description.

Referring to FIG. 14, the first semiconductor package 100 may further include an upper redistribution substrate 300. The upper redistribution substrate 300 may be on the first molding member 130. The upper redistribution substrate 300 may include a second dielectric layer 301 and second redistribution patterns 302. The second redistribution patterns 302 may each include a second wire portion 303 and a second via portion 304, which second wire and via portions 303 and 304 are integrally connected into a single unitary piece.

The pad opening may be filled with a metal via MV, and the metal via MV may be in contact with the top surface of the bonding pad 116 and with the second via portion 304 of a lowermost one of the second redistribution patterns 302. Therefore, the first semiconductor package 100 and the second semiconductor package 200 may be electrically connected to each other.

An upper connection pattern 250 may be on an upper portion of the second dielectric layer 301. The upper connection pattern 250 may be connected to the second redistribution patterns 302. The second connection terminal 240 may be in contact with the upper connection pattern 250.

A semiconductor package device according to the present inventive concepts may include a first post and a second post on the first post. The first post may have a diameter greater than that of the second post, and the second post may be on an arbitrary position on a top surface of the first post, which may result in an increase in the degree of freedom of wiring design.

In addition, in fabricating the semiconductor package device according to the present inventive concepts, a seed layer may be first formed, the first and second posts and a bonding pad may be formed, and then an etching process may be performed to from a vertical structure. In this step, the bonding pad may be used as an etching mask, and in this case it may be possible to reduce processing steps. Moreover, a lateral surface of the second post may be etched during the etching process, and thus the second post may be formed to have a small diameter. As a result, the semiconductor package device may be achieved to include fine-pitched vertical structures.

The present inventive concepts are not intended to be limited by the above-described embodiments and the accompanying drawings, but are intended to be limited by the appended claims. Accordingly, various forms of substitution, modification, and alteration may be made by those skilled in the art without departing from the scope defined by the following claims.

What is claimed is:

1. A semiconductor package device, comprising:
   a lower redistribution substrate;
   a first semiconductor chip on the lower redistribution substrate;
   a plurality of vertical structures on the lower redistribution substrate; and
   a first molding member on the lower redistribution substrate, the first molding member on the first semiconductor chip and the vertical structures,
   wherein each of the vertical structures includes:
      a first post having a first diameter;
      a second post on the first post, the second post having a second diameter; and
      a bonding pad on a top side of the second post opposite the first post, the bonding pad having a third diameter,
   wherein the first, second, and third diameters are different from each other, and
   wherein the third diameter is greater than the second diameter.

2. The semiconductor package device of claim 1, wherein the bonding pad includes:
   a first metal layer in contact with the second post; and
   a second metal layer on the first metal layer,
      wherein the second post, the first metal layer, and the second metal layer include different metallic materials from each other.

3. The semiconductor package device of claim 1, wherein the first post has a first vertical thickness, and the second post has a second vertical thickness greater than the first vertical thickness.

4. The semiconductor package device of claim 3, wherein the first diameter is greater than the second diameter.

5. The semiconductor package device of claim 1, wherein a center of the second post is offset by an amount that is greater than zero from a center of a top surface of the first post.

6. The semiconductor package device of claim 1, wherein the first post includes:
   a seed pattern; and
   a metal pattern on the seed pattern,
      wherein a difference between the third diameter and the second diameter is substantially the same as a thickness of the seed pattern.

7. The semiconductor package device of claim 1, wherein the second diameter is less than the third diameter by an amount that is between about 5 μm to about 10 μm.

8. The semiconductor package device of claim 1, wherein
the vertical structures are spaced apart from each other
along a first direction parallel to a top surface of the
lower redistribution substrate,
the second posts are spaced apart at a first distance from
each other along the first direction,
the bonding pads are spaced apart at a second distance
from each other along the first direction, and
the first distance is greater than the second distance.

9. The semiconductor package device of claim 1, wherein
the first molding member is in contact with a lateral surface
of each of the vertical structures and an edge portion of a
bottom surface of the bonding pad.

10. The semiconductor package device of claim 1,
wherein the first semiconductor chip includes a chip pad
on a surface of the first semiconductor chip facing the
lower redistribution substrate,
wherein the lower redistribution substrate includes:
a first dielectric layer; and
a first redistribution pattern in the first dielectric layer,
wherein the first redistribution pattern is in contact with
the first post and the chip pad.

11. The semiconductor package device of claim 10, further comprising an upper redistribution substrate on the first molding member,
wherein the upper redistribution substrate includes: a
second dielectric layer; and
a second redistribution pattern in the second dielectric
layer, wherein the second redistribution pattern is connected to the bonding pad.

12. The semiconductor package device of claim 11, further comprising a metal via between the second redistribution pattern and the bonding pad.

13. The semiconductor package device of claim 10, wherein a bottom surface of the second post is at a level higher than a level of a top surface of the chip pad.

14. The semiconductor package device of claim 1, further comprising a semiconductor package on the first molding member,
wherein the semiconductor package includes:
a package substrate that includes a metal pad in a lower
portion of the package substrate, the metal pad
vertically overlapped by the bonding pad;
a second semiconductor chip on the package substrate,
a second molding member on the package substrate and
the second semiconductor chip; and
a connection terminal between the bonding pad and the
metal pad.

15. A semiconductor package device, comprising:
a redistribution substrate;
a semiconductor chip on the redistribution substrate;
a plurality of vertical structures on the redistribution
substrate; and
a molding member on the redistribution substrate, the
semiconductor chip, and the plurality of vertical structures,
wherein each vertical structure of the plurality of vertical
structures includes:
a first post having a first diameter;
a second post on the first post, the second post having
a second diameter; and
a bonding pad on a top side of the second post opposite
the first post, the bonding pad having a third diameter,
wherein the first, second, and third diameters are different from each other, and wherein the molding member is in contact with an edge portion of a
bottom surface of the bonding pad.

16. The semiconductor package device of claim 15,
wherein the third diameter
is greater than the second diameter, wherein the first post
includes:
a seed pattern; and
a metal pattern on the seed pattern, and
wherein a difference between the third diameter and the
second diameter 1 s substantially the same as a thickness of the seed pattern.

17. The semiconductor package device of claim 15,
wherein the first post has a first vertical thickness,
the second post has a second vertical thickness, and
a value obtained by dividing the first vertical thickness by
the first diameter is less than a value obtained by
dividing the second vertical thickness by the second
diameter.

18. The semiconductor package device of claim 15,
wherein the bonding pad includes:
a first metal layer in contact with the second post; and
a second metal layer on the first metal layer,
wherein the first post and the second post include copper,
wherein the first metal layer includes nickel, and
wherein the second metal layer includes gold.

19. The semiconductor package device of claim 15,
wherein
the vertical structures are spaced apart from each other
along a first direction parallel to a top surface of the
redistribution substrate,
the second posts are spaced apart at a first distance from
each other along the first direction,
the bonding pads are spaced apart at a second distance
from each other along the first direction, and
the first distance is greater than the second distance.

20. A semiconductor package device, comprising:
a first semiconductor package; and
a second semiconductor package on the first semiconductor package,
wherein the first semiconductor package includes:
a redistribution substrate;
a first semiconductor chip on the redistribution substrate, the first semiconductor chip including a chip
pad on a surface of the first semiconductor chip, the
surface facing the redistribution substrate;
a plurality of vertical structures on the redistribution
substrate and spaced apart from a lateral surface of
the first semiconductor chip;
a first molding member on a top surface of the first
semiconductor chip, the lateral surface of the first
semiconductor chip, and a top surface of each of the
vertical structures; and
a plurality of first connection terminals below the
redistribution substrate,
wherein each of the vertical structures includes a first
post, a second post on the first post, and a bonding
pad on the second post,
wherein each of the first post, the second post, and
the bonding pad has a cylindrical shape,
wherein the second semiconductor package
includes:
a package substrate;
a second semiconductor chip on the package substrate;
a second molding member on the package substrate on
the second semiconductor chip;
a metal pad in a lower portion of the package substrate;
and a second connection terminal between the bonding pad and the metal pad, wherein a diameter of the second post is less than a diameter of the bonding pad by an amount that is between about 5 μm to about 10 μm, wherein the vertical structures are spaced apart from each other along a first direction parallel to a top surface of the redistribution substrate, wherein the second posts are spaced apart at a first distance from each other along the first direction, wherein the bonding pads are spaced apart at a second distance from each other along the first direction, and wherein the first distance is less than the second distance.

* * * * *